United States Patent

Yoshizawa

[11] Patent Number: 5,818,375
[45] Date of Patent: Oct. 6, 1998

[54] DIGITAL-TO-ANALOG CONVERTER

[75] Inventor: Yutaka Yoshizawa, Tokyo, Japan

[73] Assignee: NEC Corporation, Tokyo, Japan

[21] Appl. No.: 777,343

[22] Filed: Dec. 27, 1996

[30] Foreign Application Priority Data

Dec. 27, 1995 [JP] Japan .................................. 7-341524

[51] Int. Cl.$^6$ ...................................................... H03M 3/04
[52] U.S. Cl. ........................................... 341/143; 341/155
[58] Field of Search ..................................... 341/143, 144

[56] References Cited

U.S. PATENT DOCUMENTS 5,144,306  9/1992  Masuda ...................................... 341/76
5,155,743  10/1992  Jacobs ........................................ 375/28
5,313,205  5/1994  Wilson ...................................... 341/144

*Primary Examiner*—Brian K. Young
*Assistant Examiner*—Peguy JeanPierre
*Attorney, Agent, or Firm*—Young & Thompson

[57] ABSTRACT

A digital-to-analog converter comprises a digital signal processing unit for receipt of input digital signals and delta-sigma modulation of the input digital signals by oversampling so as to generate a noise shape digital signal and a digital-to-analog converter coupled to the digital signal processing unit for receipt of the noise shape digital signal from the digital signal processing unit and conversion of the noise shape digital signal into an analog signal, wherein the digital signal processing unit comprises at least a series connection of a plurality of noise shapers.

12 Claims, 3 Drawing Sheets

$Y = X + 1(1-Z^{-1})Q$ $Y = X + (1-Z^{-1})^2 Q$ $Y = \frac{1}{16}\left[\frac{1-Z^{-4}}{1-Z^{-1}}\right]^2 X$

DIGITAL-TO-ANALOG CONVERTER

BACKGROUND OF THE INVENTION

1. Field of the Invention

The present invention relates to a digital-to-analog converter, and more particularly to a digital-to-analog converter having a noise shaping feature.

2. Description of the Related Art

The noise shaping technique for the digital-to-analog converter is used along with the over-sampling technique which converts sampling frequencies into frequencies which are several times or a few hundred times higher than quantized frequencies. The quantized noise of the digital signal is shifted to a higher range than an audio range to facilitate filtering for obtaining a high signal-to-noise ratio. The digital-to-analog converter utilizing such noise shaping technique can satisfy the requirement for high signal-to-noise ratio and is suitable for a high quality compact disk player.

One of the conventional digital-to-analog converters utilizing the noise shaping technique along with the over-sampling technique is disclosed in the Japanese laid-open patent publication No. 5-67976 and will be described as follows. FIG. 1 is a block diagram illustrative of the conventional digital-to-analog converter utilizing the noise shaping technique along with the over-sampling technique. The digital-to-analog converter has the following elements. A digital filter 3 is provided which is coupled to an input terminal for receipt of a digital input signal and subsequent over-sampling process thereof to generate digital signals "A". A shift circuit 4 is provided which is coupled to the digital filter 3 for receipt of the digital signals "A" from the digital filter 3 to shift the digital signals "A" for one sample in left direction and generate shift signals "SA". A noise shaper 5 is provided which is coupled to the shift circuit 4 for receipt of the shift signals "SA" to subject the shift signals "SA" to a delta-sigma modulation to generate a shape signal "B" as a digital signal with reduced bit number. A waveform shaping circuit 6 is provided which is coupled to the noise shaper 5 for receipt of the shape signal "B" from the noise shaper 5 to shape the waveform of the shape signal "B" and generate the shaped signal "C". A linear phase filter 7 is provided which is coupled to the waveform shaping circuit 6 for receipt of the shaped signal "C" from the linear phase filter 7 to filter the shaped signal "C" and generate analog signals "AS". A buffer circuit 8 is provided which is coupled to the linear phase filter 7 for receipt of the analog signals "AS" from the linear phase filter 7 to buffer-amplify the analog signals "AS". A shift control circuit 9 is provided which is coupled to the shift circuit 4 so that the shift control circuit 9 receives a signal "P" to generate a level shift signal "Q" based upon the signal "P" and feed the level shift signal "Q" to the shift circuit 4 so that the shift circuit 4 performs shift operations in accordance with the level shift signal "Q". A clock signal generator 12 is provided which is connected to the digital filter 3 and the waveform shaping circuit 5 for generating a clock signal and feeds the same to the digital filter 3 and the waveform shaping circuit 5. A timing generator 10 is provided which is coupled to the noise shaper 5 and the clock signal generator 12 so that the timing generator 10 receives the clock signal from the clock signal generator 12 and generates the timing signal "T" based upon the clock signal. The noise shaper receives the timing signal "T". A level detection circuit 11 is provided which is coupled to the digital filter 3 for receipt of the digital signal "A" from the digital filter 3. The level detection circuit 11 is also coupled to the timing generator 10 for receipt of the timing signal "T" from the timing generator 10. The level detection circuit 11 performs detection of level of the digital signal "A" and generates a level signal "P". The level detection circuit 11 is further coupled to the shift control circuit 9 for feeding the level signal "P" to the shift control circuit 9. An attenuation control circuit 13 is provided which is coupled to the level detection circuit 11 for receipt of the level signal "P" and generating a control signal "S" based upon the level signal "P". An attenuator 14 is provided which is coupled to the attenuation control circuit 13 for receipt of the control signal "S" from the attenuation control circuit 13. The attenuator 14 is also coupled to the buffer circuit 8 for receipt of the buffer-amplified analog signals "AS" from the buffer circuit 8 and performs attenuation of the buffer-amplified analog signals "AS" under the control of the control signal "S" from the attenuation control circuit 13 to generate an output signal AO.

The digital input signal DI is over-sampled by the digital filter 3 to generate the digital signal "A". The digital signal "A" is fed to the shift circuit 4. The digital signal "A" is also fed to the level detection circuit 11. The level detection circuit 11 detects the level of the digital signal "A" to generate the level signal "P" which is fed to the shift control circuit 9 and the attenuation control circuit 13. The shift control circuit 9 generates the shift control circuit "Q" correspondent to the level of the digital signal "A" in response to the supply of the signal "P". The shift control signal "Q" is fed to the shift circuit 4. The shift circuit 4 keeps higher than a constant level the input level or the shift signal "SA" to be inputted into the noise shaper 5. The noise shaper 5 performs the delta-sigma modulation or differentiation/integration processing to the input signal "SA" to generate shape signal "B" of a reduced bit number. The waveform shaping circuit 6 performs a waveform shaping to generate the signal C. The linear phase filter 7 performs a low pass filtering to the signal "C" to generate analog signals "AS". The analog signal "AS" is fed via the buffer 8 to the attenuator 14. The attenuator control circuit 13 generates the control signal "S" corresponding to the level of the signal "P" to fed the control signal "S" to the attenuator 14. The attenuator 14 performs under the control of the control signal "S" to generate analog output signals "AO" corresponding to the level of the original digital signal "A".

According to the conventional digital-to-analog converter circuit, any input digital signal with lower than a predetermined level is detected to enable the shift circuit 4 to increase the level of the input signal so that it is possible to obtain a high signal-to-noise ratio even at a low over-sampling ratio.

In the conventional digital-to-analog converter circuit described above, it is possible to obtain a high signal-to-noise ratio at a low over-sampling ratio. Notwithstanding, it is required to obtain such high signal-to-noise ratio by a single noise shaper, for which reason the noise shaper must have a higher order and multiple bit structure, resulting in an increased hardware amount of the noise shaper.

Further, it is required to provide level control circuits for controlling the signal levels for the level detection circuit and the attenuator, resulting in a further increase in the hardware and also increase in the power consumption.

SUMMARY OF THE INVENTION

Accordingly, it is an object of the present invention to provide a novel digital-to-analog converter free from the above problems and disadvantages as described above.

It is a further object of the present invention to provide a novel digital-to-analog converter showing a high signal-to-noise ratio.

It is a further more object of the present invention to provide a novel digital-to-analog converter capable of obtaining a high signal-to-noise ratio by a reduced hardware amount.

It is a further more object of the present invention to provide a novel digital-to-analog converter operable with a reduced power consumption.

The above and other objects, features and advantages of the present invention will be apparent from the following descriptions.

The present invention provides a digital-to-analog converter comprising a digital signal processing unit for receipt of input digital signals and delta-sigma modulation of the input digital signals by over-sampling process so as to generate a noise shape digital signal and a digital-to-analog converter coupled to the digital signal processing unit for receipt of the noise shape digital signal from the digital signal processing unit and conversion of the noise shape digital signal into an analog signal, wherein the digital signal processing unit comprises at least a series connection of a plurality of noise shapers.

BRIEF DESCRIPTIONS OF THE DRAWINGS

Preferred embodiments according to the present invention will be described in detail with reference to the accompanying drawings.

DESCRIPTION OF THE PREFERRED EMBODIMENT

Figure 1:
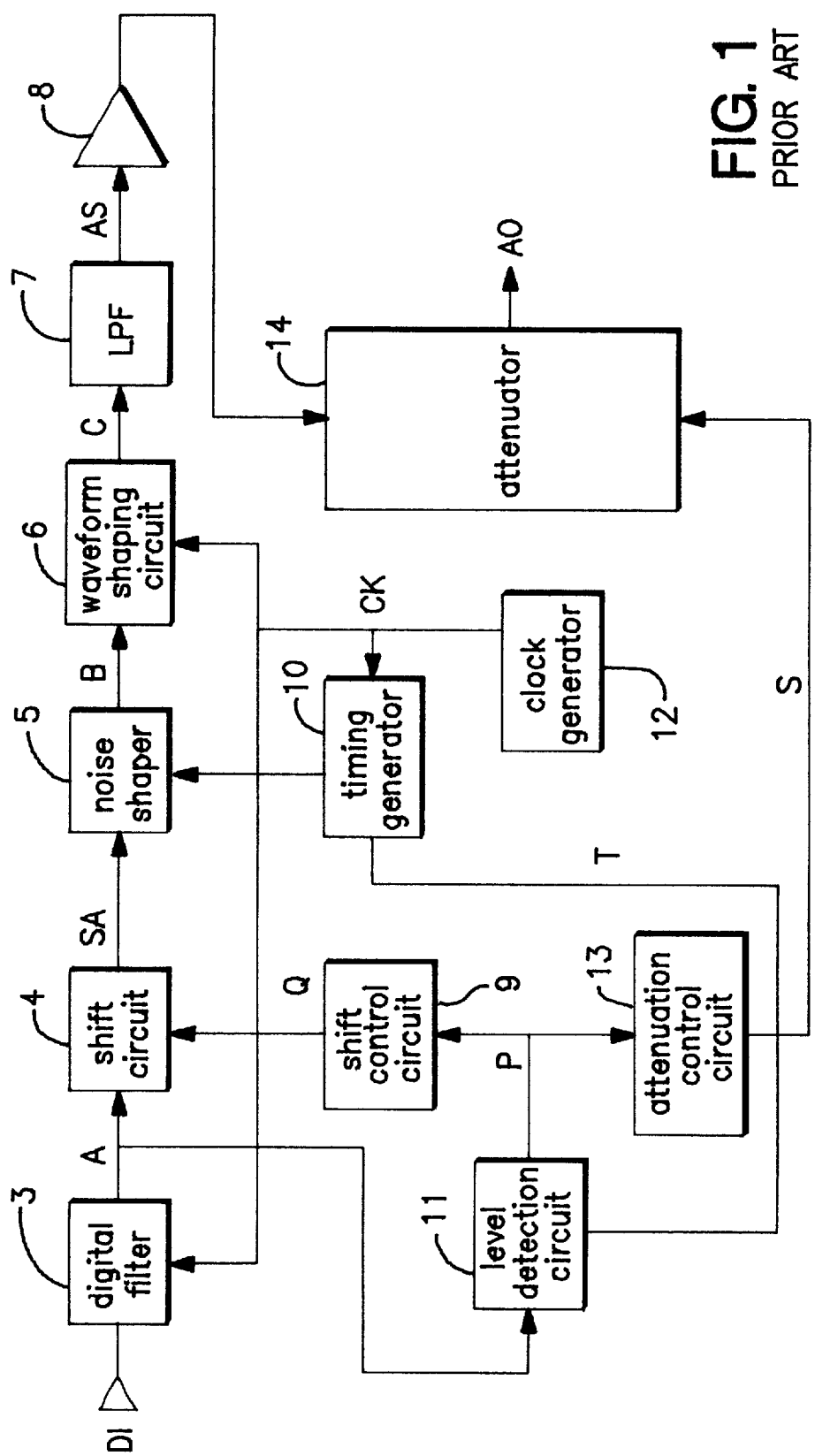
FIG. 1 is a block diagram illustrative of the conventional analog-to-digital converter.
Figure 2:
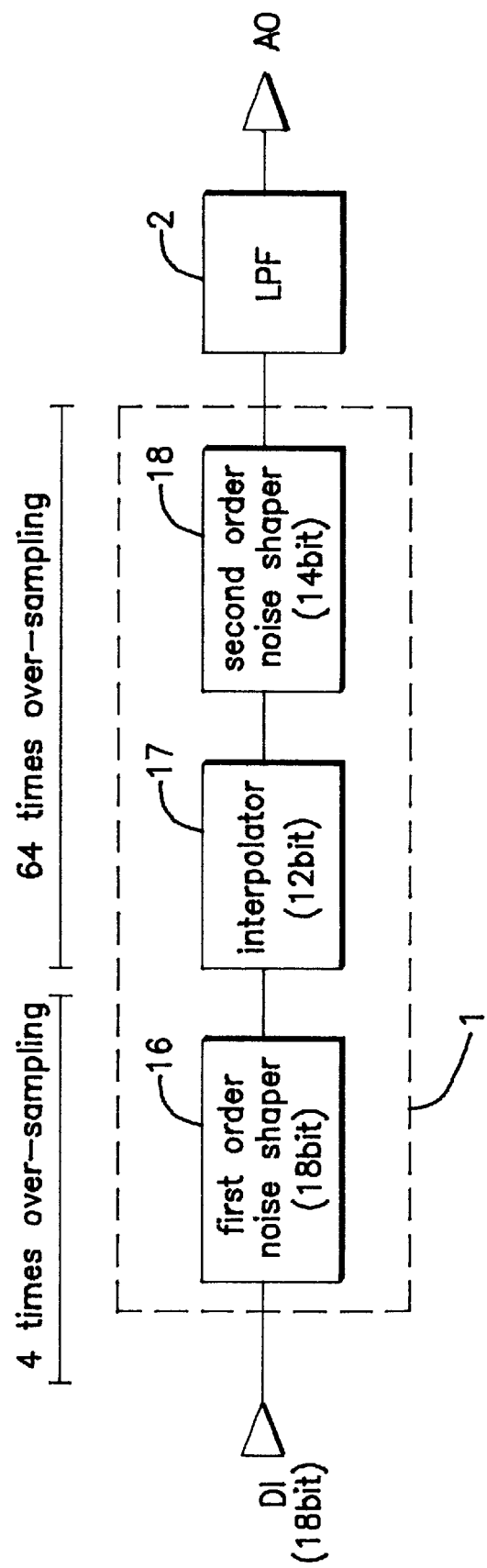
FIG. 2 is a block diagram illustrative of a novel analog-to-digital converter in a first embodiment according to the present invention.

The present invention provides a digital-to-analog converter comprising a digital signal processing unit for receipt of input digital signals and delta-sigma modulation of the input digital signals by over-sampling process so as to generate a noise shape digital signal and a digital-to-analog converter coupled to the digital signal processing unit for receipt of the noise shape digital signal from the digital signal processing unit and conversion of the noise shape digital signal into an analog signal, wherein the digital signal processing unit comprises at least a series connection of a plurality of noise shapers.

It is preferable that the digital signal processing unit comprises a first noise shaper on a front stage and a second noise shaper on a rear stage and connected in series to the first noise shaper.

It is preferable to further provide a digital filter between the noise shapers connected in series. The digital filter may comprise an interpolator.

The first noise shaper acting as an integrator may comprise an adder and a first ordered delay comparator coupled to the adder so that the adder adds a first input number to a second input number and then based upon a result of a comparison by the comparator, output from the comparator is fed back to the adder to realize a first ordered noise shaping.

The interpolator may comprise a subtracter for subtraction between a third input number and a fourth input number, a first resistor coupled to the subtracter for receipt of the subtraction data from the subtracter to temporarily hold the subtraction data, an adder coupled to the first resistor for fetching the subtraction data from the first resistor to add the third input number to the subtraction data, and a second resistor coupled to the adder for temporarily holding the added data to generate the third input number so as to realize a linear interpolator.

The second noise shaper may comprise a first adder for adding a first input number to a second input number, a resistor coupled to the first adder for receipt of the added data from the first adder and temporarily holding the added data, a second adder coupled to the resistor for fetching the added data from the resistor and adding the fetched data into the second input number, and a comparator coupled to the second adder, based upon a comparison of the comparator, output from the comparator is fed back to the first and second adders to realize a second ordered noise shaping.

A first embodiment according to the present invention will be described in detail with reference to FIGS. 2 through 5, wherein a novel digital-to-analog converter is provided which is capable of obtaining a high signal-to-noise ratio by a reduced hardware amount at a reduced power consumption.

The novel digital-to-analog converter comprises a digital signal processing unit 1 acting as an up-sampler which processes digital input signals "DI" of 18 bits to generate a second ordered shaper signal "DA" and a linear phase filter 2 coupled to the digital signal processing unit 1 for receipt of the second ordered shaper signal "DA" and converting the second ordered shaper signal "DA" into analog signals to generate analog output signals "AO".

The digital signal processing unit 1 comprises the following elements. A first ordered noise shaper 16 is provided for receipt of the 18-bit digital input signal "DI" and subsequent four times over-sampling delta-sigma modulation of the 18-bit digital input signal "DI" to generate a 12-bit first ordered shaper signal "M". A 12-bit interpolator 17 is provided which is coupled to the first order noise shaper 16 for receipt of the 12-bit first order shaper signal "M" from the first order noise shaper 16 and subsequent sixteen times up-sampling of the 12-bit first order shaper signal "M" to generate 14-bit interpolated data "ID". A second ordered noise shaper 18 is provided for receipt of the 14-bit interpolated data "ID" and subsequent sixty fur times over-sampling delta-sigma modulation of the 14-bit interpolated data "ID" to generate a second order shaper signal "DA".

The first noise shaper 16 performs a noise shaping to the 18-bit digital input signal "DI" by the four times over-sampling first ordered delta-sigma sigma modulation to generate the first order shaper signal "M". The first order shaper signal "M" is fed to the interpolator 17. The interpolator 17 performs sixteen times up-sampling of the first order shaper signal "M" to generate 14-bit interpolator data "ID". The 14-bit interpolator data "ID" is fed to the second order noise shaper 18. The second order noise shaper 18 performs a noise shaping to the 14-bit interpolator data "ID"

by the sixty four times over-sampling delta-sigma modulation to generate the second order shaper signal "DA". The linear phase filer 2 performs a low pass filtering to the second order shaper signal "DA" for digital-to-analog conversion to generate analog output signal "DO".

Figure 3:
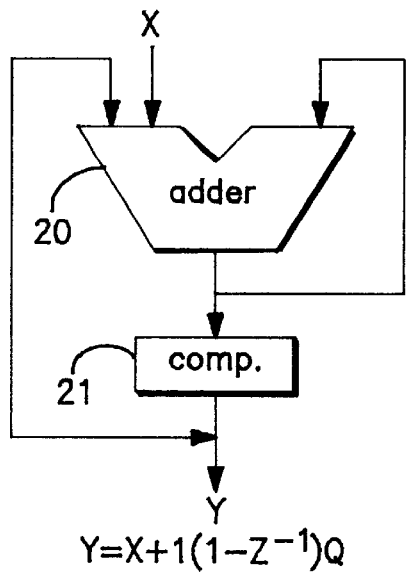
FIG. 3 is a circuit diagram illustrative of a first ordered noise shaper in a novel analog-to-digital converter in a first embodiment according to the present invention.

FIG. 3 is illustrative of a first order noise shaper in the digital signal processing unit in the novel analog-to-digital converter. The first order noise shaper performs as an integrator and comprises an adder 20 and a first order delay comparator 21 coupled to the adder 20. The adder 20 adds the input number "X" to the added number "Y". Based upon the result of the comparison of the comparator 21, output from the comparator 21 is fed back to the adder 20 to realize the first order noise shaping.

Figure 4:
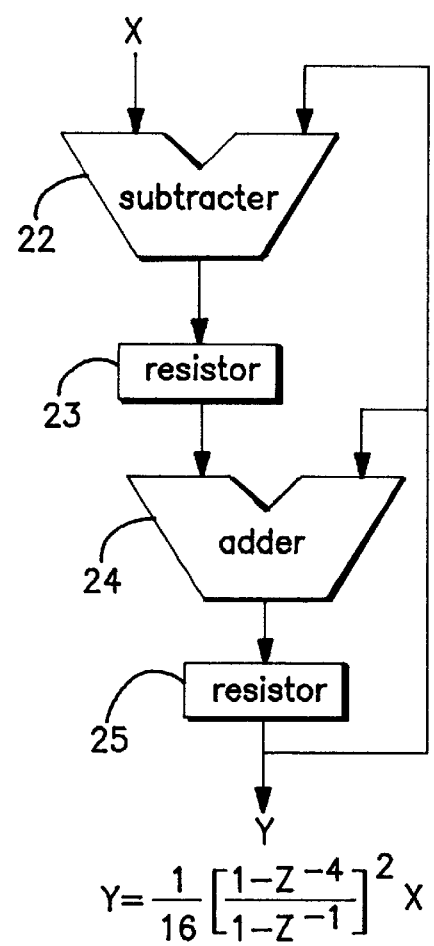
FIG. 4 is a circuit diagram illustrative of an interpolator provided between first and second ordered noise shapers in a novel analog-to-digital converter in a first embodiment according to the present invention.

FIG. 4 is illustrative of the interpolator 17 provided between first and second order noise shapers 16 and 18 in the digital signal processing unit 1. The interpolator 17 comprises a subtracter 22 for subtraction between the input number "X" and the number "Y", a first resistor 23 coupled to the subtracter 22 for receipt of the subtraction data from the subtracter 22 to temporarily hold the subtraction data, an adder 24 coupled to the first resister 23 for fetching the subtraction data from the first resistor 23 to add the number "Y" to the subtraction data and a second resistor 25 coupled to the adder 24 for temporarily hold the addition data to generate the number "Y" so as to realize a sixteen times linear interpolator.

Figure 5:
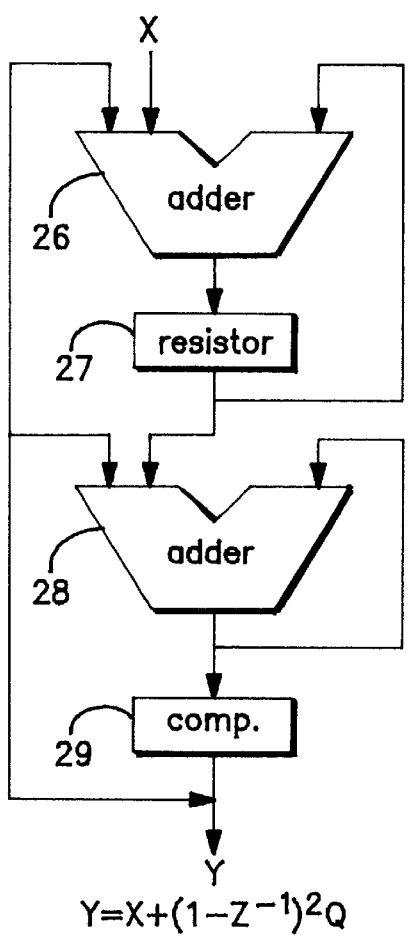
FIG. 5 is a circuit diagram illustrative of a second ordered noise shaper in a novel analog-to-digital converter in a first embodiment according to the present invention.

FIG. 5 is a circuit diagram illustrative of the second ordered noise shaper 18 in the digital signal processing unit 1. The second order noise shaper 18 comprises a first adder 26 for adding an input number "X" to the number "Y", a resistor 27 coupled to the first adder 26 for receipt of the added data from the first adder 26 and temporarily holding the added data, a second adder 28 coupled to the resistor 27 for receipt of the added data from the resister 27 and adding these data from the resister 27 into the number "Y", and a comparator 29 coupled to the second adder 28 for receipt of the data from the second adder 28 and subsequent comparison, based upon which the output from the comparator 29 is fed back as the added number "Y" to the first and second adders 26 and 28 to realize the second order noise shaping.

Accordingly, the number of gates necessary to form the first and second noise shapers 16 and 18 and the interpolator 17 are as follows.

The number of gates for the interpolator 17=(input bit number+2)×20.

The number of gates for the first noise shaper 16=(input bit number+2)×10.

The number of gates for the second noise shaper 16= (input bit number+2)×20.

Under the following conditions, the digital signal processing unit in accordance with the present invention is compared in circuit scale to the digital filer 3 and the noise shaper 5, both of which perform substantially the sane functions of the digital filter 3 and the noise shaper 5 in the conventional digital-to-analog converter, provided that 18-bit data "D", are inputted which have already been subjected to the four times up-sampling.

The conventional digital filter 3 is sixteen times interpolator of 18-bit input whilst the noise shaper 5 is 22-bit input sixty four times over-sampling second ordered delta-sigma noise shaper.

The total number of the gates necessary for forming the digital filter 3 and the noise shaper 5 is approximately 880 gates.

On the other hand, in accordance with the present invention, the number of gates necessary for forming the digital processing unit 1 is 840 gates which is smaller than that of the conventional analog-to-digital converter. The digital processing unit 1 does not need any level control circuit, resulting in a considerable reduction in hardware amount.

The power consumption of the analog-to-digital converter is proportional to the product of the number of gates and system clock frequency. This system clock frequency is proportional to the over-sampling rate, for which reason the power consumption is approximated to be equal to the product of the gate number and the over-sampling rate to compare the power consumption of between the novel analog-to-digital converter and the conventional one.

In the conventional analog-to-digital converter, the number of gates is 880 and the over-sampling rate is 64 and then the power consumption is equal to 56320. In the novel analog-to-digital converter, for the first order noise shaper 16, the number of gates is 200 and the over-sampling rate is 4, so the power consumption is equal to 800. For the interpolator 17, the number of gates is 280 and the over-sampling rate is 64 and then the power consumption is equal to 17920. For the second ordered noise shaper 18, the number of gates is 320 and the over-sampling rate is 64, with the result that power consumption is equal to 20480. The total power consumption of the digital signal processing unit is 41760 which is lower than that of the above conventional one.

Under the following conditions, there will be made a comparison in signal-to-noise ratio between the novel analog-to-digital converter to the conventional analog-to-digital converter. The signal-to-noise ratio of the N-ordered m-bit output delta-sigma over-sampling converter s given as follows.

$$S/N = 6.02 \text{ m} + 1.76 + 10\{\log{(2N+1)\pi(Fs/2\pi Fb) \times (2N+1)}\}$$

where Fb is the signal band and Fs is the sampling frequency.

In the prior art, the second ordered one bit over-sampling is carried out and the formula $Fs=(\frac{1}{2}) \times Fb \times 64$ is given. A peak of the signal-to-noise ratio is calculated to be 87 dB.

On the other hand, according to the present invention, the first order noise shaper is 143 dB and the signal-to-noise ratio of the total system is substantially defined in the second stage, resulting in 87 dB.

As described above, in accordance with the present invention, the digital signal is inputted into the first ordered noise shaper on the first stage for noise shaping of the input digital data to reduce the word length of the signal. The digital signals with the reduced word length is then inputted into the second ordered noise shaper on the second stage so as to reduce the bit number of the arithmetic elements used in the noise shaper. This results in a reduction in the hardware amount of the digital-to-analog converter.

Two noise shapers are connected in series to increase the over-sampling ratio of the noise shaper on the rear stage for obtaining a high signal-to-noise ratio. It is possible to drop the over-sampling rate of the noise shaper on the front stage and also reduce the hardware amount of the noise shaper on the rear stage, resulting in a reduction in power consumption of the digital-to-noise ratio.

As described above, a plurality of noise shapers are connected in series in the digital signal processing unit in order to obtain the high signal-to-noise ratio.

Contrary to the prior art, there is no need to provide any level control circuit to obtain a high signal-to-noise ratio.

Further, it is possible to reduce the number of the interpolator and the noise shaper on the rear stage, resulting in a reduction in hardware amount of the digital signal processing unit in the digital-to-analog converter. Moreover, it is possible to reduce the hardware amount and the operational speed of the digital-to-analog converter for obtaining a reduction in power consumption.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A digital-to-analog converter comprising:

a digital signal processing unit for receipt of input digital signals and delta-sigma modulation of the input digital signals by over-sampling process so as to generate a noise shape digital signal; and a digital-to-analog converter coupled to the digital signal processing unit for receipt of the noise shape digital signal from the digital signal processing unit and conversion of the noise shape digital signal into an analog signal, wherein the digital signal processing unit comprises at least a series connection of a plurality of noise shapers and a digital filter provided between the noise shapers connected in series.

2. The digital-to-analog converter as claimed in claim 1, wherein the digital signal processing unit comprises:

a first noise shaper on a front stage; and a second noise shaper on a rear stage and connected in series to the first noise shaper.

3. The digital-to-analog converter as claimed in claim 2, wherein the first noise shaper acting as an integrator comprises an adder and a first order delay comparator coupled to the adder so that the adder adds a first input number to a second input number and then based upon a result of a comparison by the comparator, output from the comparator is fed back to the adder to realize a first ordered noise shaping.

4. The digital-to-analog converter as claimed in claim 2, wherein the second noise shaper comprises:

a first adder for adding a first input number to a second input number;

a resistor coupled to the first adder for receipt of the added data from the first adder and temporarily holding the added data;

a second adder coupled to the resistor for fetching the added data from the resistor and adding the fetched data into the second input number; and a comparator coupled to the second adder so that based upon a comparison of the comparator, output from the comparator is fed back to the first and second adders to realize a second order noise shaping.

5. The digital-to-analog converter as claimed in claim 1, wherein the digital filter comprises a linear interpolator.

6. The digital-to-analog converter as claimed in claim 5, wherein the interpolator comprises:

a subtractor for subtraction between a third input number and a fourth input number;

a first resistor coupled to the subtracter for receipt of the subtraction data from the subtracter to temporary hold the subtraction data;

an adder coupled to the first resistor for fetching the subtraction data from the first resistor to add the third input number to the subtraction data; and a second resistor coupled to the adder for temporarily holding the added data to generate the third input number so as to realize a linear interpolator.

7. A digital signal process for a digital-to-analog converter, said digital signal processor performing a delta-sigma modulation of an input digital signal through over-sampling process to generate a noise shape digital signal, wherein the digital signal processing unit comprises at least a series connection of a plurality of noise shapers and a digital filter provided between the noise shapers connected in series.

8. The digital signal processor as claimed in claim 7, wherein the digital signal processing unit comprises:

a first noise shaper on a front stage; and a second noise shaper on a rear stage and connected in series to the first noise shaper.

9. The digital signal processor as claimed in claim 8, wherein the first noise shaper acting as an integrator comprises an adder and a first order delay comparator coupled to the adder so that the adder adds a first input number to a second input number and then based upon a result of a comparison by the comparator, output from the comparator is fed back to the adder to realize a first order noise shaping.

10. The digital signal processor as claimed in claim 8, wherein the second noise shaper comprises:

a first adder for adding a first input number to a second input number;

a resistor coupled to the first adder for receipt of the added data from the first adder and temporarily holding the added data;

a second adder coupled to the resistor for fetching the added data from the resistor and adding the fetched data into the second input number; and a comparator coupled to the second adder so that based upon a comparison of the comparator, output from the comparator is fed back to the first and second adders to realize a second order noise shaping.

11. The digital signal processor as claimed in claim 7, wherein the digital filter comprises a linear interpolator.

12. The digital signal processor as claimed in claim 11, wherein the interpolator comprises:

a subtractor for subtraction between a third input number and a fourth input number;

a first resistor coupled to the subtractor for receipt of the subtraction data from the subtractor to temporarily hold the subtraction data;

an adder coupled to the first resistor for fetching the subtraction data from the first resistor to add the third input number to the subtraction data; and a second resistor coupled to the adder for temporarily holding the added data to generate the third input number so as to realize a linear interpolator.

* * * * *